United States Patent
Papavasiliou et al.

(12) 
(10) Patent No.: US 10,699,954 B2
(45) Date of Patent: Jun. 30, 2020

(54) THROUGH-SUBSTRATE VIAS FORMED BY BOTTOM-UP ELECTROPLATING

(71) Applicant: Teledyne Scientific & Imaging, LLC, Thousand Oaks, CA (US)

(72) Inventors: Alexandros Papavasiliou, Thousand Oaks, CA (US); Adam Young, Westlake Village, CA (US); Robert Mihailovich, Newbury Park, CA (US); Jeff DeNatale, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 15/957,693

(22) Filed: Apr. 19, 2018

(65) Prior Publication Data

US 2019/0326171 A1    Oct. 24, 2019

(51) Int. Cl.
| | |
|---|---|
| *H01L 21/4763* | (2006.01) |
| *H01L 23/48* | (2006.01) |
| *H01L 23/52* | (2006.01) |
| *H01L 21/768* | (2006.01) |
| *H01L 23/498* | (2006.01) |

(52) U.S. Cl.
CPC .. *H01L 21/76898* (2013.01); *H01L 21/76879* (2013.01); *H01L 23/481* (2013.01); *H01L 23/49811* (2013.01); *H01L 23/49827* (2013.01)

(58) Field of Classification Search
CPC ............. H01L 21/76879; H01L 23/481; H01L 23/49811; H01L 23/49827; H01L 21/76841; H01L 21/76802; H01L 21/76831; H01L 21/76834; H01L 21/76843; H01L 23/5526; H01L 23/5384
USPC .................................. 257/774; 438/629, 637
See application file for complete search history.

(56) References Cited

U.S. PATENT DOCUMENTS

| | | | |
|---|---|---|---|
| 6,399,479 | B1 | 6/2002 | Chen et al. |
| 7,129,567 | B2 | 10/2006 | Kirby et al. |
| 7,265,052 | B2 | 9/2007 | Sinha |
| 7,741,218 | B2 | 6/2010 | Sparks et al. |
| 8,102,049 | B2 | 1/2012 | Takahashi et al. |
| 2004/0173909 | A1 | 9/2004 | Sinha et al. |
| 2008/0206984 | A1 | 8/2008 | Sparks et al. |
| 2009/0134497 | A1 | 5/2009 | Barth et al. |
| 2009/0302480 | A1 | 12/2009 | Birner et al. |
| 2009/0305502 | A1* | 12/2009 | Lee .................. H01L 21/76898 438/667 |
| 2010/0072579 | A1 | 3/2010 | Thies et al. |
| 2010/0237472 | A1 | 9/2010 | Gillis et al. |

(Continued)

*Primary Examiner* — Jami Valentine Miller
*Assistant Examiner* — Dilinh P Nguyen
(74) *Attorney, Agent, or Firm* — M. J. Ram and Associates

(57) ABSTRACT

A method of forming void-free, high aspect ratio through-substrate vias by "bottom-up" electroplating. In one embodiment, the method requires providing a substrate, forming a dielectric layer on the substrate's bottom side, providing at least one perforation through the dielectric layer, forming a via hole through the substrate from its top side to the dielectric layer and over the perforations, forming an isolation layer on the sidewalls of the via hole, forming a metal seed layer on the bottom side of the dielectric layer, electroplating the seed layer such that all of the perforations are plugged, and electroplating up the via hole from the plugs to fill the via hole.

21 Claims, 8 Drawing Sheets

(56) References Cited

U.S. PATENT DOCUMENTS

| | | |
|---|---|---|
| 2011/0210452 A1 | 9/2011 | Roozeboom et al. |
| 2011/0260297 A1 | 10/2011 | Lin et al. |
| 2012/0133047 A1 | 5/2012 | Besling et al. |
| 2013/0075268 A1 | 3/2013 | England |
| 2013/0249047 A1* | 9/2013 | Hung ................ H01L 21/76898 257/506 |
| 2013/0260556 A1* | 10/2013 | Farooq ................ H01L 21/6835 438/667 |
| 2014/0231986 A1 | 8/2014 | Dubin |

* cited by examiner

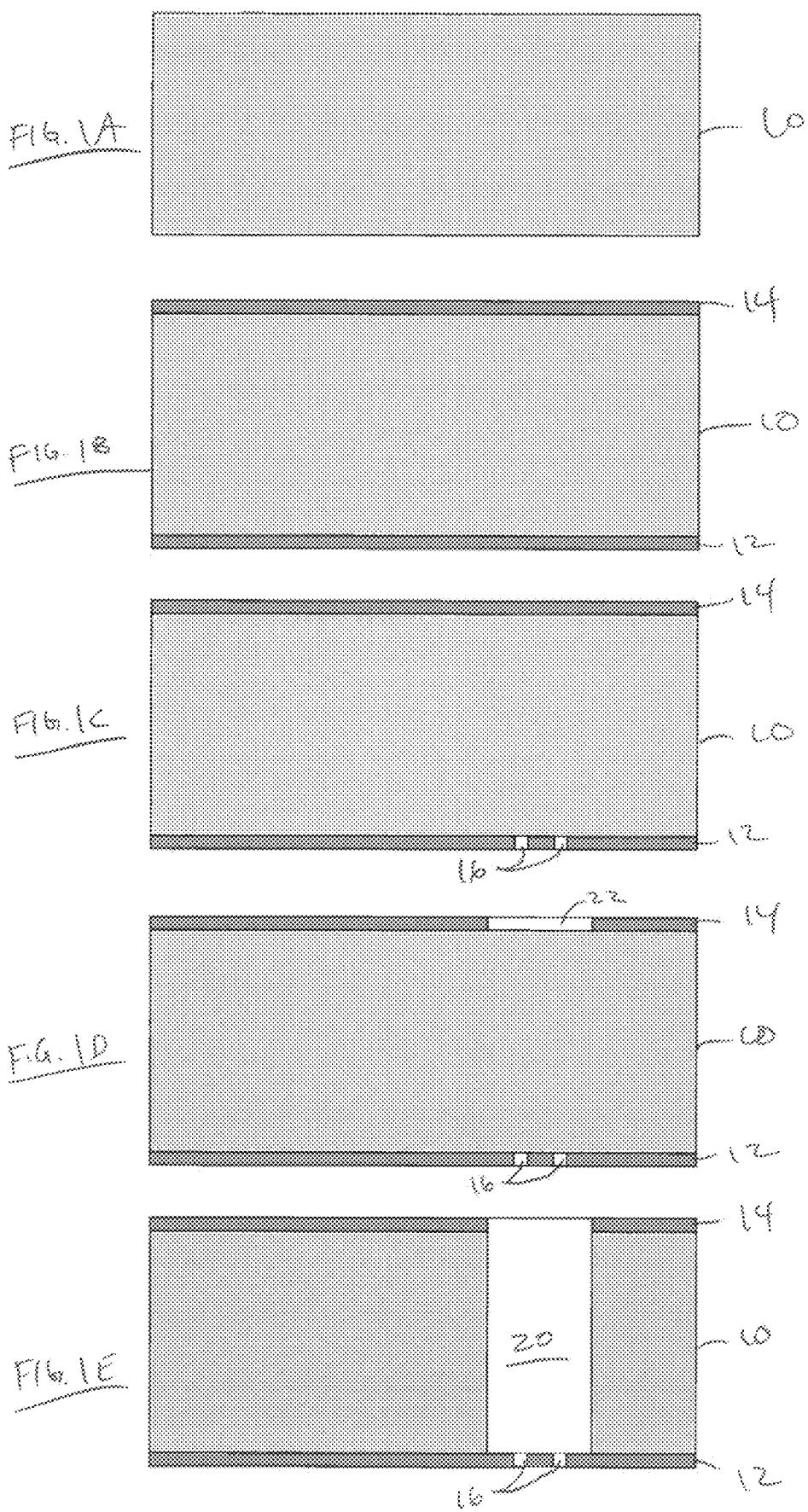

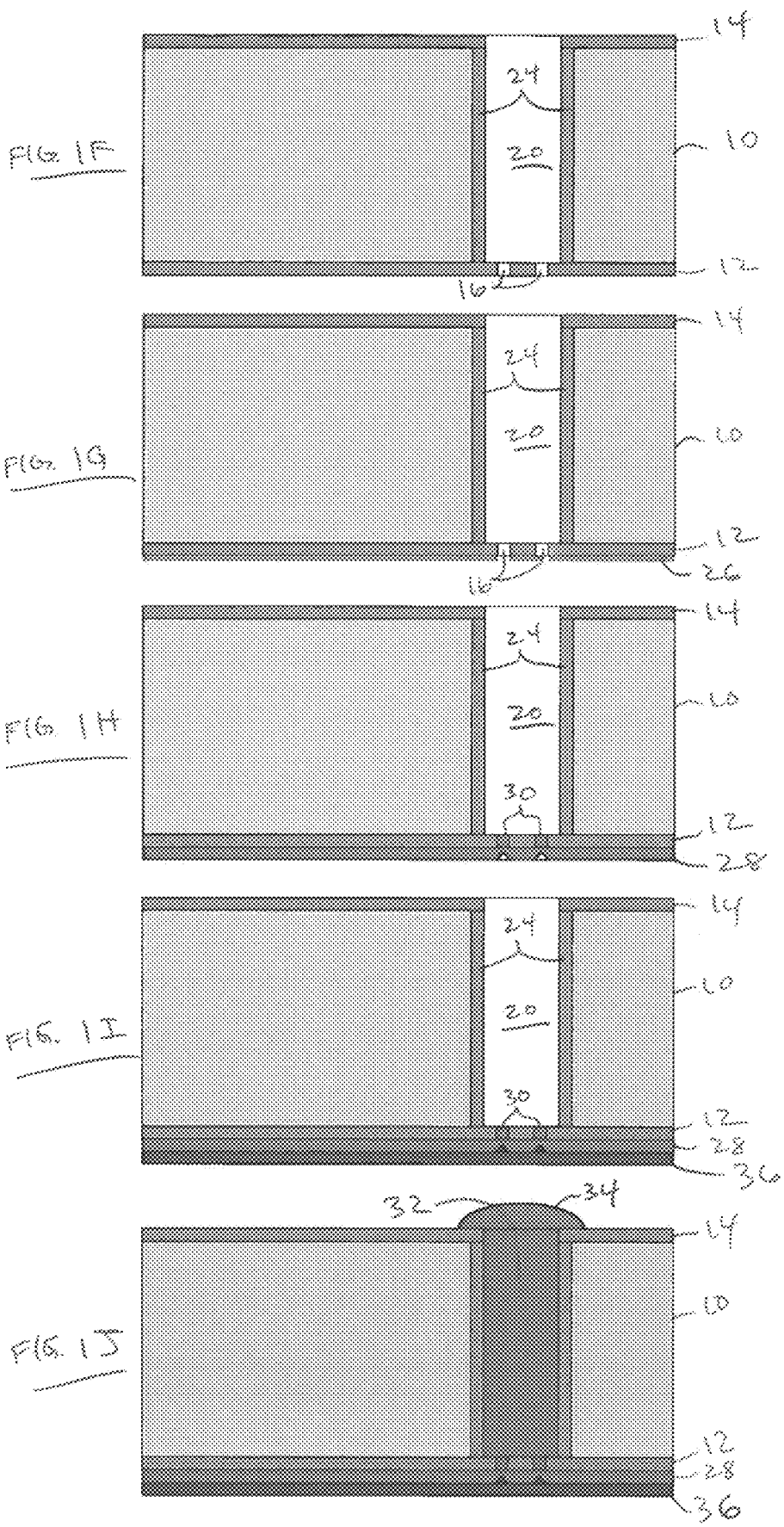

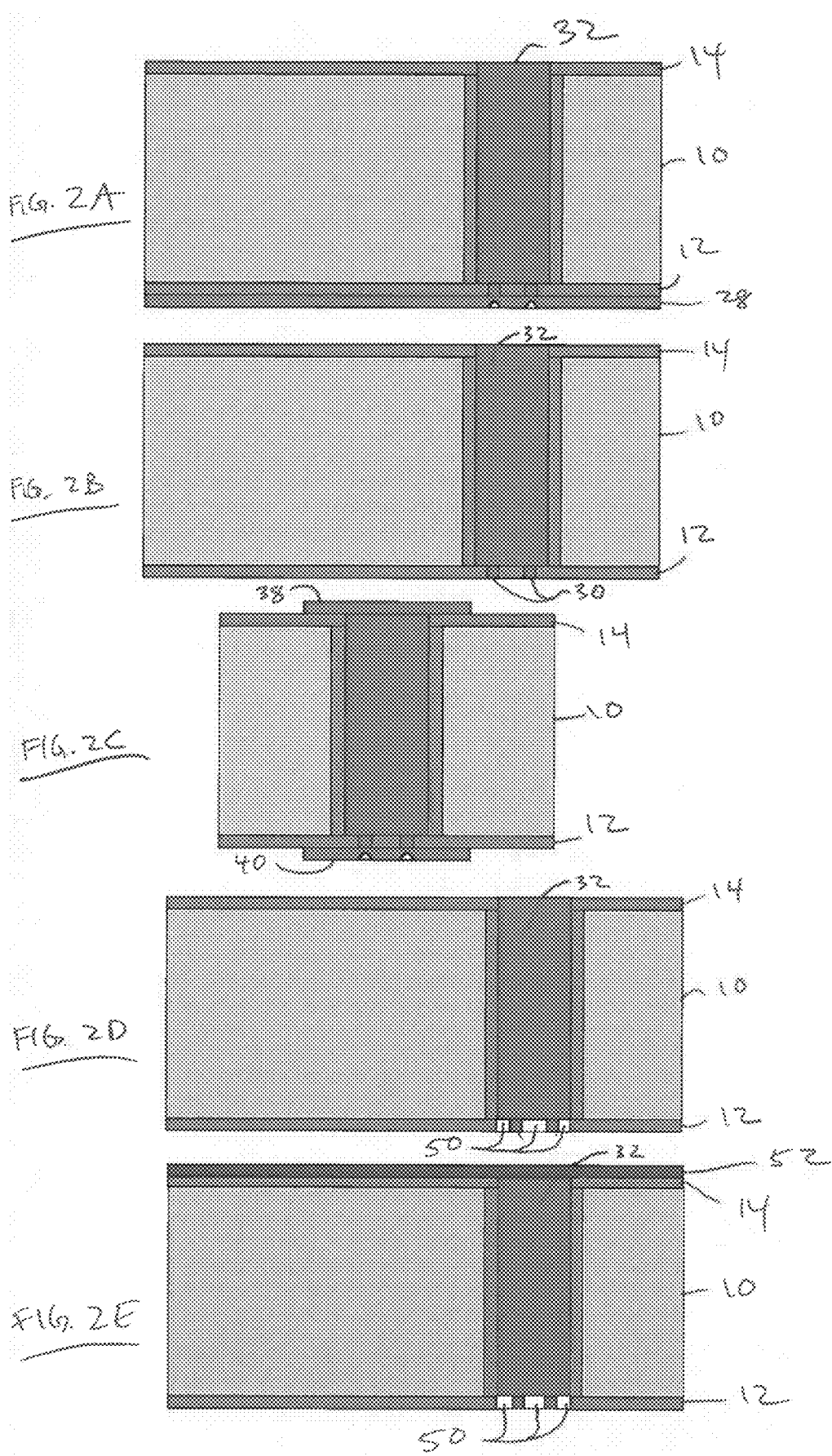

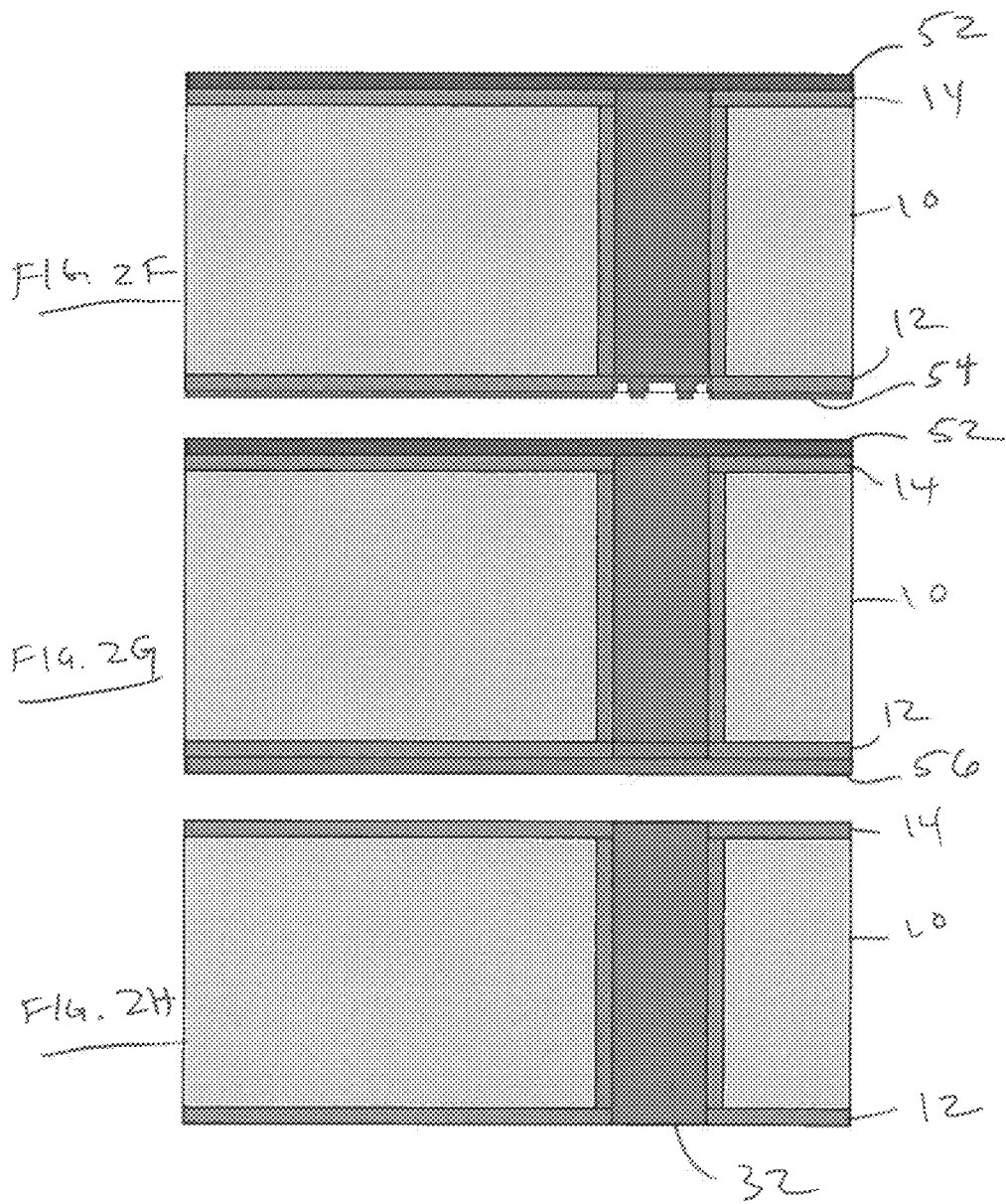

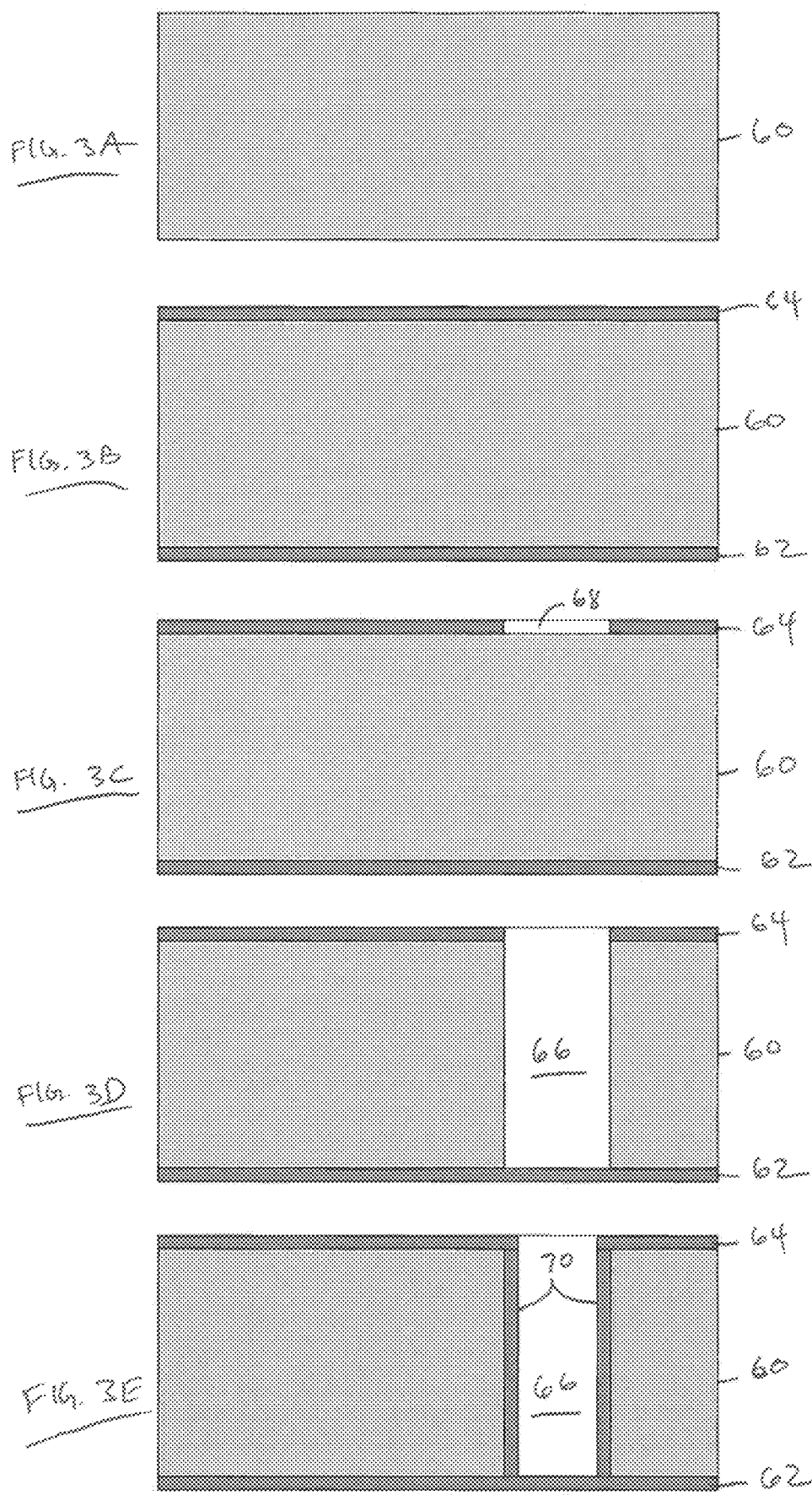

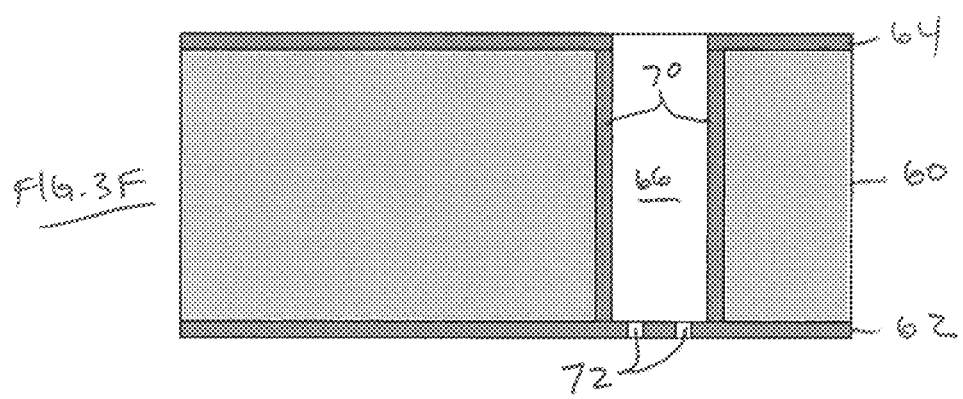

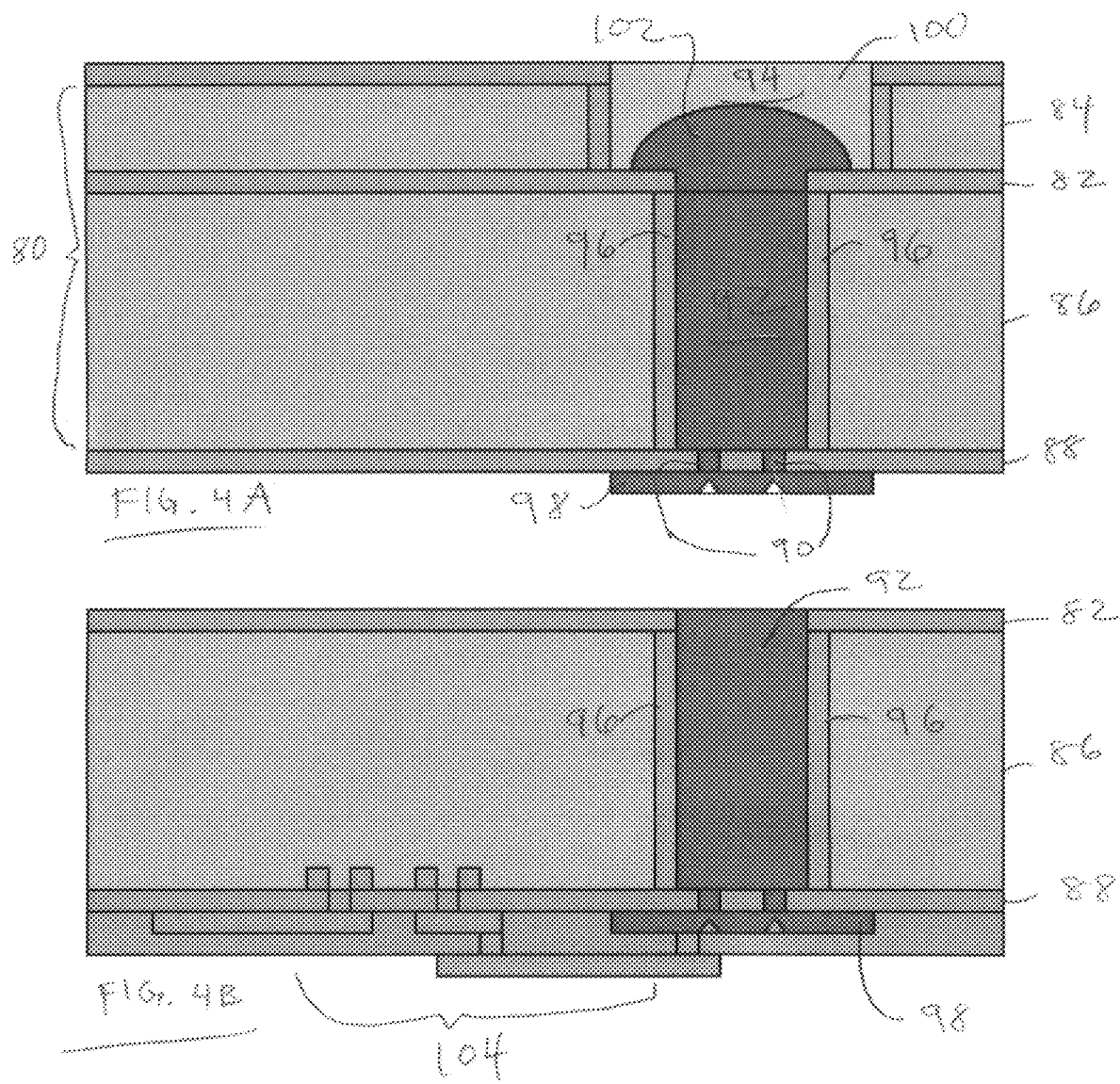

THROUGH-SUBSTRATE VIAS FORMED BY BOTTOM-UP ELECTROPLATING

BACKGROUND OF THE INVENTION

Field of the Invention

This invention relates generally to through-substrate vias, and more particularly to a method of forming through-substrate vias by electroplating from the bottom of the via upward.

Description of the Related Art

When fabricating integrated circuits, there are many circumstances in which it is necessary to provide a "through-substrate via"—i.e., a metal-filled hole that can serve as a conductive path from the top to the bottom of a substrate. Such a via may be needed to, for example, provide an electrical connection between a circuit element or metallization layer that is on the top surface of the substrate and a corresponding circuit element or metallization layer on the substrate's bottom surface.

To minimize the amount of substrate area such a via requires, it is preferred that the via be as narrow as possible. If the substrate is considerably thicker than the desired via width, the via will have a "high aspect ratio". One conventional way in which through-substrate vias are formed is with the use of electroplating: a "seed layer" is sputtered on the sidewalls of a hole that has been formed through a substrate, and the hole is filled with metal by electroplating from the seed layer toward the center of the hole. However, plating from the sidewall in this way limits the permissible aspect ratio, because as aspect ratio increases the difficulty in plating a solid via without voids increases.

SUMMARY OF THE INVENTION

A method of forming a through-substrate via is presented which overcomes the problems noted above, enabling the fabrication of solid, void-free vias even when the via has a high aspect ratio.

The present method requires that through-substrate vias be formed by "bottom-up" electroplating. In one embodiment, the method requires providing a substrate, forming a dielectric layer on the substrate's bottom side, providing at least one perforation through the dielectric layer, forming a via hole through the substrate from its top side to the dielectric layer and over the at least one perforation, forming an isolation layer on the sidewalls of the via hole, forming a metal seed layer on the bottom side of the dielectric layer, electroplating the seed layer such that all of the perforations are plugged, and electroplating up the via hole from the plugs in the perforations until the via hole is filled with metal.

Other embodiments of the present method include a process sequence in which a via hole is formed prior to perforating the dielectric layer, forming a via hole through a silicon-on-insulator (SOI) substrate, and forming a via hole through a double silicon-on-insulator (DSOI) substrate.

These and other features, aspects, and advantages of the present invention will become better understood with reference to the following drawings, description, and claims.

BRIEF DESCRIPTION OF THE DRAWINGS

FIGS. 1A-1J are sectional diagrams illustrating one embodiment of the present method of forming a through-substrate via.

FIGS. 2A-2H are sectional diagrams illustrating further processing that might be performed on a substrate in which through-substrate vias per the present method have been formed.

FIGS. 3A-3F are sectional diagrams illustrating an alternate fabrication sequence in accordance with the present invention.

FIGS. 4A and 4B are sectional diagrams illustrating the formation of a through-substrate via per the present method, when the substrate is an SOI substrate.

FIGS. 4A and 4B are sectional diagrams illustrating the formation of a through-substrate via per the present method, when the substrate is an SOI substrate.

DETAILED DESCRIPTION OF THE INVENTION

Figure 5A:
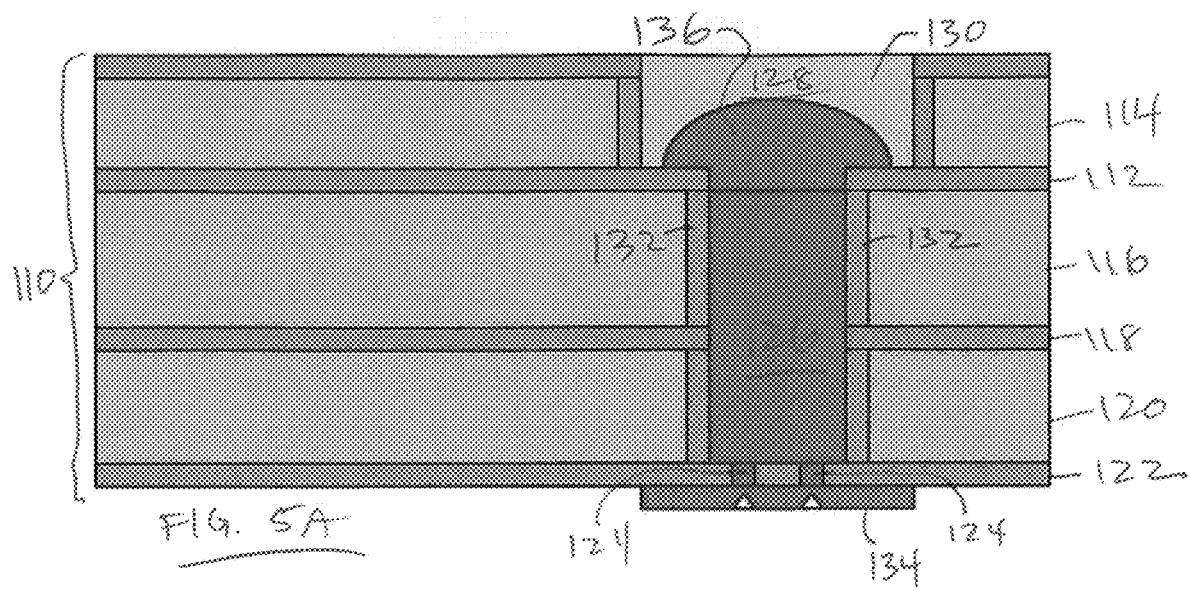
FIGS. 5A and 5B are sectional diagrams illustrating the formation of a through-substrate via per the present method, when the substrate is a DSOI substrate.

One embodiment of the present method of forming a through-substrate via is illustrated in FIGS. 1A-1J. As shown in FIG. 1A, a substrate 10 is provided, having a top side and a bottom side. A dielectric layer 12 is formed on the bottom side of substrate 10, typically by oxidation; a dielectric layer 14 might also be formed on the top side of the substrate (FIG. 1B). In FIG. 1C, at least one perforation 16 is provided through bottom dielectric layer 12, preferably by patterning and etching.

As shown in FIGS. 1D and 1E, a via hole 20 is formed through substrate 10 from the substrate's top side to dielectric layer 12 on its bottom side, positioned such that the via hole is over at least one perforation 16. This is preferably accomplished by patterning and etching an opening 22 through dielectric layer 14 to define the location of the via hole, and then patterning and etching substrate 10 down to dielectric layer 12. An isolation layer 24 is then formed on the sidewalls of via hole 20, as shown in FIG. 1F.

In FIG. 1G, a metal seed layer 26 is formed on the bottom side of bottom dielectric layer 12. The metal seed layer is then electroplated, such that a metal layer 28 is formed and all of perforations 16 are pinched closed and fully plugged with plated metal (30) (FIG. 1H). Per FIGS. 1I and 1J, via hole 20 is electroplated up the via hole from the plugs 30 in perforations 16 at least until the via hole is filled with metal 32 (this step may result in "overplating", such that a "mushroom" of metal 34 protrudes above the top surface of substrate 10).

By "bottom-up plating" in this way, a solid, void-free via may be formed which is isolated from the substrate, even when the via has a high aspect ratio. The present method thus overcomes the limitations imposed when plating from the sidewalls of a via hole; as noted above, plating from a sidewall limits the aspect ratio because as aspect ratio increases, the difficulty in plating a solid via without voids increases. The present method is compatible with many fabrication technologies.

To avoid electroplating on the bottom side of the substrate while the via hole is being plated, a protective layer 36 (shown in FIGS. 1I and 1J) may optionally be formed on the bottom side of metal layer 28 prior to the step of plating up the via hole; the protective layer preferably comprises photoresist or resin. Alternatively, protective layer 36 may comprise a wafer bonded to the bottom side of the substrate. A means of providing a conductive path to metal layer 28 through protective layer 36 needs to be provided to facilitate electroplating up the via hole.

The present method can be used with many substrate types; a preferred substrate is silicon. Similarly, dielectric layers 12 and 14 can be many different materials, with silicon nitride ($Si_3N_4$), silicon dioxide ($SiO_2$), or alumina ($Al_2O_3$) preferred. The dielectric layers may be formed in a number of different ways, with thermal oxidation, atomic layer deposition (ALD), or plasma-enhanced chemical vapor deposition (PECVD) preferred. The etching steps described above are preferably performed using reactive-ion etching (RIE).

Two perforations 16 are illustrated in the exemplary embodiment described above; however, in practice, the at least one perforation preferably comprises a plurality of perforations. Smaller perforations are preferred, as a small hole will be easier to pinch off during the electroplating step shown in FIG. 1H. Many perforations are preferred as this provides a larger area for electroplating up the via hole; this also helps the metal to plate up evenly and to carry more current.

Isolation layer 24 is preferably formed using a high temperature method such as thermal oxidation, ALD, or TEOS; this enables the device to undergo subsequent processing without compromising the vias. Metal seed layer 26 is preferably formed using evaporation, though sputtering could also be used, with gold or copper being the preferred seed metals.

Additional processing may be performed after the solid, void-free via is formed as described above. For example, one or both ends of the via would typically receive further processing. In FIG. 2A, the metal mushroom portion (34) extending above the top of substrate 10 has been polished away such that the surface is planarized, preferably by chemical mechanical polishing (CMP) or grinding. Similarly, metal layer 28 may be polished away as shown in FIG. 2B. Alternatively, as shown in FIG. 2C, overplate metal 34 and metal layer 28 may be patterned and etched (preferably wet etched) to leave metal contacts 38 and 40, to which electrical connections can be made.

To have the via extend to the bottom of dielectric layer 12, there must be metal across the full width of the area in which plugs 30 reside. FIGS. 2D-2H (which continue from FIG. 2B) illustrate using electroplating to accomplish this, though other methods such as sputtering or evaporation might also be used. In FIG. 2D, at least one perforation 50 is patterned and etched through dielectric layer 12 on the bottom side of substrate 10 below the filled via hole. To avoid electroplating on the top side of the substrate, a protective layer 52 may optionally be formed on the top side of dielectric metal layer 14 and over the filled via hole prior to the step of electroplating; the protective layer preferably comprises photoresist or resin. Alternatively, protective layer 52 may comprise a wafer bonded to the top side of the substrate. A metal seed layer 54 is formed on the bottom side of dielectric layer 12 (FIG. 2F), which is electroplated to plug perforations 50 and to form a metal layer 56 on the bottom side of substrate 10 (FIG. 2G). Metal layer 56 may then be polished away (FIG. 2H); alternatively, layer 56 could be patterned and etched such that portions of the layer remain, to provide a contact to the via, for example.

One possible alternative to the process described above is to form the via hole prior to perforating the dielectric layer. This is illustrated in FIGS. 3A-3F. As shown in FIG. 3A, a substrate 60 is provided, having a top side and a bottom side. A dielectric layer 62 is formed on the bottom side of substrate 60, typically by oxidation; a dielectric layer 64 might also be formed on the top side of the substrate (FIG. 3B).

As shown in FIGS. 3C and 3D, a via hole 66 is formed through substrate 60 from the substrate's top side to dielectric layer 62 on its bottom side. This is preferably accomplished by patterning and etching an opening 68 through dielectric layer 64 to define the location of the via hole, and then patterning and etching substrate 60 down to dielectric layer 62. An isolation layer 70 is formed on the sidewalls of via hole 60, as shown in FIG. 3E. Then, per FIG. 3F, at least one perforation 72 is provided through bottom dielectric layer 62, preferably by patterning and etching, positioned such that the via hole 66 is over perforations 72. This results in a structure similar to that shown in FIG. 1F. The process may then continue from this point using the process steps shown in FIGS. 1G-1J and described above.

As with the method described in FIGS. 1A-1J, dielectric layers 62 and 64 can be many different materials, with silicon nitride ($Si_3N_4$), silicon dioxide ($SiO_2$), or alumina ($Al_2O_3$) preferred. The dielectric layers may be formed in a number of different ways, with thermal oxidation, atomic layer deposition (ALD), or plasma-enhanced chemical vapor deposition (PECVD) preferred. The etching steps described above preferably employ reactive-ion etching (RIE). Two perforations 72 are illustrated in FIG. 3F; however, in practice, the at least one perforation preferably comprises a plurality of perforations, with smaller perforations preferred as discussed above. Isolation layer 70 is preferably formed using thermal oxidation, ALD, or TEOS.

Another possible embodiment of the present method is illustrated in FIGS. 4A and 4B; all of the individual steps are not shown as they are performed in the same manner as analogous steps previously described. Here, the substrate in which the via is to be formed is a silicon-on-insulator (SOI) substrate 80, which has a buried oxide layer 82 sandwiched between a top silicon layer 84 and a bottom silicon layer 86. A dielectric layer 88 is formed on the bottom side of substrate 80. At least one perforation 90 is made through dielectric layer 88, and a via hole is formed through SOI substrate 80 from its top side to dielectric layer 88 over the at least one perforation 90.

The via hole comprises a first portion 92 between the bottom of SOI substrate 80 and buried oxide layer 82, and a second portion 94 between the top of the SOI substrate and the buried oxide layer. The via hole may be formed using a two-step etch such that the first and second portions have different widths; for example, first portion 92 can be narrower than second portion 94, with the narrower portion used for the eventual via and the wider portion being part of a handle layer.

In the manner previously described, an isolation layer 96 is formed on the sidewalls of the via hole, a metal seed layer (not shown) is formed on the bottom side of dielectric layer 88, the metal seed layer is electroplated such that all of perforations 90 are plugged, which also forms a metal layer 98 on the bottom side of dielectric layer 88; at this point, the via hole is electroplated up the via hole from the plugs in perforations 90 at least until the via hole's first portion 92 is filled with metal. Metal layer 98 can be patterned and etched to form a contact to the bottom side of the via, as shown in FIG. 4A.

As noted above, the via hole's second portion 94 may be part of a handle layer, and may be filled with epoxy 100 to protect the plated metal from subsequent etching steps. Then, as shown in FIG. 4B, the silicon portion of the handle layer is etched away, with the etch stopping at buried oxide layer 82, and epoxy 100 is etched away, preferably with an $O_2$ plasma. Any overplate 102 can then be polished down, and the completed via may be used to provide a conductive path to circuitry or metallization 104 formed on the bottom side of substrate 80.

Note that though circuitry or metallization 104 is described as being on the "bottom" of substrate 80, in practice the substrate may be inverted with respect to the orientation shown in FIGS. 4A and 4B such that circuitry/metallization 104 is on "top" of the substrate, and/or circuitry or metallization 104 might be formed on the opposite side of that shown in FIGS. 4A and 4B, or even on both sides of substrate 80. This method is well-suited to applications in which the substrate is to be thinned.

Figure 5B:
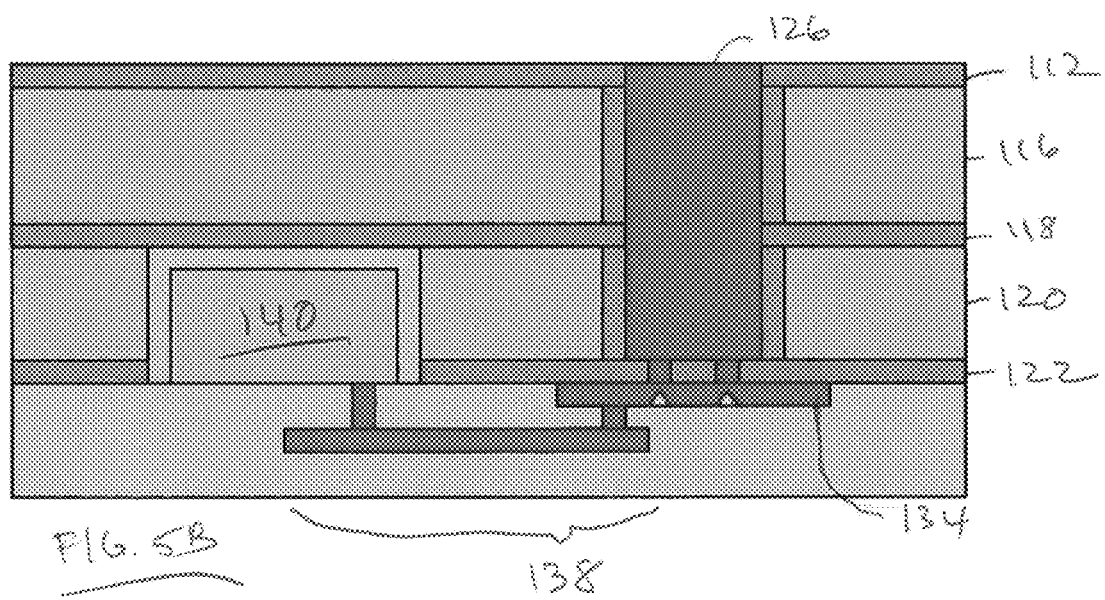

Another possible embodiment of the present method is illustrated in FIGS. 5A and 5B; all of the individual steps are not shown as they are performed in the same manner as analogous steps previously described. Here, the substrate in which the via is to be formed is a double silicon-on-insulator (DSOI) substrate 110, which has a first buried oxide layer 112 sandwiched between a top silicon layer 114 and a middle silicon layer 116, and a second buried layer 118 sandwiched between middle silicon layer 116 and a bottom silicon layer 120. A dielectric layer 122 is formed on the bottom side of substrate 110. At least one perforation 124 is made through dielectric layer 122, and a via hole is formed through DSOI substrate 110 from its top side to dielectric layer 122 over the at least one perforation 124.

In this exemplary embodiment, the via hole comprises a first portion 126 between the bottom of DSOI substrate 110 and the top of middle silicon layer 116, and a second portion 128 between the top of the middle silicon layer and the top of the substrate. As above, the via hole may be formed using a two-step etch such that the first and second portions have different widths; for example, first portion 126 can be narrower that second portion 128, with the narrower portion used for the eventual via and the wider portion being part of a handle layer, which may be filled with epoxy 130 to protect the metal that will be plated up the via hole from subsequent etching steps.

In the manner previously described, an isolation layer 132 is formed on the sidewalls of the via hole, a metal seed layer (not shown) is formed on the bottom side of dielectric layer 122, the metal seed layer is electroplated such that all of perforations 124 are plugged, which also forms a metal layer 134 on the bottom side of dielectric layer 122; at this point, the via hole is electroplated up the via hole from the plugs in perforations 124 at least until the via hole's first portion 126 is filled with metal. Metal layer 134 can be patterned and etched to form a contact to the bottom side of the via, as shown in FIG. 5A.

Then, as shown in FIG. 5B, the silicon portion of the handle layer is etched away, with the etch stopping at buried oxide layer 112, and epoxy 100 is etched away, preferably with an $O_2$ plasma. Any overplate 136 can then be polished down, and the completed via may be used to provide a conductive path to circuitry or metallization 138 formed on the bottom side of substrate 110; this can include "buried" chips such as buried chip 140.

Note that though circuitry or metallization 138 is described as being on the "bottom" of substrate 110, in practice the substrate may be inverted with respect to the orientation shown in FIGS. 5A and 5B such that circuitry/metallization 138/140 is on "top" of the substrate, and/or the circuitry or metallization might be formed on the opposite side of that shown in FIGS. 5A and 5B, or even on both sides of substrate 110. This method is well-suited to forming vias used as an interposer for buried chip applications.

Forming vias as described herein may be a first step in a fabrication process. For example, one or more vias may be formed through a substrate per the present method, with the substrate then undergoing subsequent processing to produce circuits or other useful structures on the substrate which are subsequently electrically connected to the vias.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of forming a through-substrate via, comprising:
    providing a substrate, said substrate having a top side and a bottom side;
    forming a dielectric layer on the bottom side of said substrate;
    providing at least one perforation through said dielectric layer;
    forming a via hole through said substrate from said top side to said dielectric layer on said bottom side over said at least one perforation;
    forming an isolation layer on the sidewalls of said via hole;
    forming a metal seed layer on the bottom side of said dielectric layer;
    electroplating said metal seed layer such that said metal seed layer plugs each of said at least one perforation, the portions of said metal seed layer plugging said at least one perforation being plugs; and
    bottom-up electroplating up the via hole from said plugs at least until said via hole is filled with metal.

2. The method of claim 1, wherein said substrate is silicon.

3. The method of claim 1, wherein said dielectric layer comprises silicon nitride ($Si_3N_4$), silicon dioxide ($SiO_2$), or alumina ($Al_2O_3$).

4. The method of claim 1, wherein said dielectric layer is formed using thermal oxidation, atomic layer deposition (ALD), or plasma-enhanced chemical vapor deposition (PECVD).

5. The method of claim 1, wherein forming a via hole through said substrate comprises patterning and etching said substrate.

6. The method of claim 1, wherein said providing at least one perforation comprises patterning and etching said dielectric layer.

7. The method of claim 6, wherein said etching comprises reactive-ion etching (RIE).

8. The method of claim 6, wherein said providing at least one perforation comprises providing a plurality of perforations.

9. The method of claim 1, wherein said isolation layer is formed using thermal oxidation, ALD, or TEOS.

10. The method of claim 1, wherein said metal seed layer is formed using evaporation or sputtering.

11. The method of claim 1, wherein said metal seed layer comprises gold or copper.

12. The method of claim 1, further comprising providing a protective layer on the bottom side of said metal seed layer prior to said step of electroplating up the via hole.

13. The method of claim 12, wherein said protective layer comprises photoresist or resin.

14. The method of claim 12, wherein said protective layer comprises a wafer bonded to the bottom side of said substrate.

15. The method of claim 1, further comprising polishing down overplate.

16. The method of claim 15, wherein said overplate is polished using chemical-mechanical planarization (CMP) or grinding.

17. The method of claim 1, further comprising:
providing a protective layer on the top side of said substrate and over said filled via hole;
providing at least one perforation through said dielectric layer on the bottom side of said substrate below said filled via hole;
forming a second metal seed layer on the bottom side of said dielectric layer on the bottom side of said substrate; and
electroplating said second metal seed layer to plug said perforations and to plate the bottom side of said substrate.

18. The method of claim 17, further comprising polishing away said plated metal on the bottom side of said substrate.

19. The method of claim 17, further comprising patterning and etching said plated metal on the bottom side of said substrate to provide a contact to said filled via hole.

20. The method of claim 1, further comprising forming electrical connections to both ends of said through-substrate via.

21. A method of forming a through-substrate via, comprising:
providing a substrate, said substrate having a top side and a bottom side;
forming a dielectric layer on the bottom side of said substrate;
forming a via hole through said substrate from said top side to said dielectric layer;
forming an isolation layer on the sidewalls of said via hole;
providing at least one perforation through said dielectric layer at the bottom of said via;
forming a metal seed layer on the bottom side of said dielectric layer;
electroplating said metal seed layer such that said metal seed layer plugs each of said at least one perforations, the portions of said metal seed layer plugging said at least one perforation being plugs; and
bottom-up electroplating up the via hole from said plugs at least until said via hole is filled with metal.

* * * * *